US011489501B2

(12) United States Patent
Rabjohn

(10) Patent No.: US 11,489,501 B2
(45) Date of Patent: Nov. 1, 2022

(54) AMPLIFIER DISTORTION DETECTION SYSTEM

(71) Applicant: SKYWORKS SOLUTIONS, INC., Irvine, CA (US)

(72) Inventor: Gordon Glen Rabjohn, Ottawa (CA)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 91 days.

(21) Appl. No.: 17/072,131

(22) Filed: Oct. 16, 2020

(65) Prior Publication Data

US 2021/0119593 A1  Apr. 22, 2021

Related U.S. Application Data

(60) Provisional application No. 62/923,039, filed on Oct. 18, 2019.

(51) Int. Cl.
*H03F 3/45* (2006.01)
*H04B 1/40* (2015.01)

(52) U.S. Cl.
CPC ........... *H03F 3/4508* (2013.01); *H04B 1/40* (2013.01); *H03F 2200/372* (2013.01); *H03F 2200/451* (2013.01)

(58) Field of Classification Search
CPC .................................................. H03F 3/4508
See application file for complete search history.

(56) References Cited

U.S. PATENT DOCUMENTS

| 5,282,124 | A | * | 1/1994 | Nakamura | .......... | H02J 7/00304 |
| | | | | | | 363/56.05 |
| 5,442,283 | A | * | 8/1995 | Vig | .................. | G01P 3/489 |
| | | | | | | 324/207.2 |
| 5,751,510 | A | * | 5/1998 | Smith | ................ | G11B 5/59683 |
| 5,943,177 | A | * | 8/1999 | Mathews | .......... | G11B 20/10055 |
| | | | | | | 360/32 |
| 6,088,176 | A | * | 7/2000 | Smith | ................ | G11B 5/012 |
| 2011/0063027 | A1 | * | 3/2011 | Kishii | ................ | H03F 3/217 |
| | | | | | | 330/251 |
| 2014/0169426 | A1 | * | 6/2014 | Aziz | ................ | H04L 25/03057 |
| | | | | | | 375/232 |

\* cited by examiner

*Primary Examiner* — Patricia T Nguyen
(74) *Attorney, Agent, or Firm* — Lando & Anastasi, LLP

(57) ABSTRACT

According to one aspect, embodiments of the invention provide a distortion detection circuit comprising an input configured to be coupled to an output stage of an amplifier and to receive an RF signal from the output stage of the amplifier, an output configured to be coupled to a module of the amplifier, at least one peak detection circuit coupled to the input and configured to monitor the RF signal and output a first signal based on positive voltage peaks of the RF signal, and a differential amplifier having an input coupled to the at least one peak detection circuit and configured to monitor the first signal and provide a second signal to the output in response to a voltage of the first signal exceeding a threshold level indicative of distortion in the RF signal.

16 Claims, 12 Drawing Sheets

AMPLIFIER DISTORTION DETECTION SYSTEM

CROSS-REFERENCE TO RELATED APPLICATIONS

This application claims priority under 35 U.S.C. § 119(e) to U.S. Provisional Patent Application No. 62/923,039, titled AMPLIFIER DISTORTION DETECTION SYSTEM, filed Oct. 18, 2019, the content of which is incorporated herein in its entirety for all purposes.

BACKGROUND

In conventional RF front-end systems, it is generally desired to match the output impedance of an amplifier module with the load impedance of a corresponding antenna such that reflections from the antenna are reduced or eliminated and/or to achieve certain characteristics, such as linearity. Reflections from the antenna to the amplifier module, and resulting standing waves, can impact the behavior of power amplifiers in the amplifier module and reduce efficiency of the power amplifiers. In extreme cases, such reflections can cause damage to the power amplifiers.

FIG. 1 is a block diagram illustrating an example of a typical arrangement of a Radio-Frequency (RF) "front-end" sub-system or module (FEM) 100 as may be used in a communications device, such as a mobile phone, for example, to transmit RF signals. The FEM 100 shown in FIG. 1 includes a transmit path (TX) configured to provide signals to an antenna for transmission; however, the FEM 100 may also include a receive path (RX) configured to process signals received by the antenna. In the transmit path (TX), a power amplifier module 110 provides gain to an RF signal 105 input to the FEM 100 via an input port 101, producing an amplified RF signal. The power amplifier module 110 can include one or more Power Amplifiers (PA). The FEM 100 can further include a filtering sub-subsystem or module 120, which can include one or more filters. A directional coupler 130 can also be used to extract a portion of the power from the RF signal traveling between the power amplifier module 110 and an antenna 140 connected to the FEM 100. The antenna 140 can transmit the RF signal and can also receive RF signals. A switching circuit 150, also referred to as an Antenna Switch Module (ASM), can be used to switch between a transmitting mode and receiving mode of the FEM 100, for example, or between different transmit or receive frequency bands. The switching circuit 150 can be operated under the control of a controller 160. The controller 160 can also communicate with the power amplifier module 110. The FEM 100 may also include one or more Low-Noise Amplifiers (LNA).

SUMMARY

A distortion detection circuit is described herein that directly monitors the output voltage waveform at the collector of a power amplifier in an RF transmitter for clipping to identify saturation of the power amplifier due to a mismatch or excessive RF drive. At least one aspect of the invention is directed to a distortion detection circuit comprising an input configured to be coupled to an output stage of an amplifier and to receive an RF signal from the output stage of the amplifier, an output configured to be coupled to a module of the amplifier, at least one peak detection circuit coupled to the input and configured to monitor the RF signal and output a first signal based on positive voltage peaks of the RF signal, and a differential amplifier having an input coupled to the at least one peak detection circuit and configured to monitor the first signal and provide a second signal to the output in response to a voltage of the first signal exceeding a threshold level indicative of distortion in the RF signal.

According to one embodiment, the at least one peak detection circuit includes a positive peak detection circuit coupled between the input and the differential amplifier. In one embodiment, the positive peak detection circuit has a diode coupled to the input of the distortion detection circuit, a capacitor coupled between the diode and ground, a first resistor coupled between the diode and the input of the differential amplifier, and a second resistor coupled between the input of the differential amplifier and ground. In another embodiment, the positive peak detection circuit is configured to output the first signal having a voltage level following the positive voltage peaks of the RF signal.

According to another embodiment, the at least one peak detection circuit further includes a negative peak detection circuit coupled between the input and the differential amplifier. In one embodiment, the positive peak detection circuit has a first diode with an anode coupled to the input of the distortion detection circuit, a capacitor coupled between a cathode of the first diode and ground, and a first resistor coupled between the cathode of the diode and the input of the differential amplifier. In another embodiment, the negative peak detection circuit has a second diode with cathode coupled to the input of the distortion detection circuit, a capacitor coupled between an anode of the second diode and ground, and a second resistor coupled between the anode of the second diode and the input of the differential amplifier. In one embodiment, the positive peak detection circuit is configured to monitor positive voltage peak levels of the RF signal, the negative peak detection circuit is configured to monitor negative voltage peak levels of the RF signal, and the positive and negative peak detection circuits are further configured to output, in combination, the first signal having a voltage level corresponding to an average of the monitored positive voltage peak levels and the monitored negative voltage peak levels.

According to one embodiment, the differential amplifier is configured to compare a voltage level of the first signal to the threshold level, to provide the second signal to the output at a first state in response to the voltage level of the first signal exceeding the threshold level, and to provide the second signal to the output at a second state in response to the voltage level of the first signal being below the threshold level. In one embodiment, the distortion detection circuit further comprises a latch circuit coupled to the differential amplifier and configured to maintain the second signal at the first state while the voltage level of the first signal is below the threshold level. In another embodiment, the distortion detection circuit further comprises a shut-off circuit coupled to the differential amplifier and configured to decouple the at least one peak detection circuit and the differential amplifier from ground in response to the amplifier turning off. In one embodiment, in response to the amplifier turning on, after previously being turned off, the latch circuit is configured to be reset such that it allows the second signal to be driven to the second state. In another embodiment, the differential amplifier is further configured to provide the second signal to one of a transceiver and baseband subsystem.

Another aspect of the invention is directed to a front-end module for a wireless device comprising an input port configured to receive an input Radio Frequency (RF) signal, a power amplifier coupled to the input port and configured to amplify the input RF signal to provide a first RF signal, an output configured to be coupled to an antenna, to receive a second RF signal from the antenna in a receive mode of operation, and to transmit the first RF signal from the power amplifier to the antenna in a transmit mode of operation, and a distortion detection circuit including an input configured to be coupled to an output stage of the power amplifier and to receive the first RF signal from the output stage of the power amplifier, an output configured to be coupled to a module of the power amplifier, at least one peak detection circuit coupled to the input of the distortion detection circuit and configured to monitor the first RF signal and output a first signal based on positive voltage peaks of the first RF signal, and a differential amplifier having an input coupled to the at least one peak detection circuit and configured to monitor the first signal and provide a second signal to the output in response to a voltage of the first signal exceeding a threshold level indicative of distortion in the first RF signal.

According to one embodiment, the at least one peak detection circuit includes a positive peak detection circuit coupled between the input of the distortion detection circuit and the differential amplifier. In one embodiment, the positive peak detection circuit has a diode coupled to the input of the distortion detection circuit, a capacitor coupled between the diode and ground, a first resistor coupled between the diode and the input of the differential amplifier, and a second resistor coupled between the input of the differential amplifier and ground. In another embodiment, the positive peak detection circuit is configured to output the first signal having a voltage level following the positive voltage peaks of the first RF signal.

According to another embodiment, the at least one peak detection circuit further includes a negative peak detection circuit coupled between the input of the distortion detection circuit and the differential amplifier. In one embodiment, the positive peak detection circuit has a first diode with an anode coupled to the input of the distortion detection circuit, a capacitor coupled between a cathode of the first diode and ground, and a first resistor coupled between the cathode of the diode and the input of the differential amplifier. In another embodiment, the negative peak detection circuit has a second diode with a cathode coupled to the input of the distortion detection circuit, a capacitor coupled between an anode of the second diode and ground, and a second resistor coupled between the anode of the second diode and the input of the differential amplifier. In one embodiment, the positive peak detection circuit is configured to monitor positive voltage peak levels of the first RF signal, the negative peak detection circuit is configured to monitor negative voltage peak levels of the first RF signal, and the positive and negative peak detection circuits are further configured to output, in combination, the first signal having a voltage level equal to an average of the monitored positive voltage peak levels and the monitored negative voltage peak levels.

According to one embodiment, the differential amplifier is configured to compare a voltage level of the first signal to the threshold level, to provide the second signal to the output at a first state in response to the voltage level of the first signal exceeding the threshold level, and to provide the second signal to the output at a second state in response to the voltage level of the first signal being below the threshold level. In one embodiment, the power amplifier includes a bias module configured to receive the second signal from the differential amplifier and to reduce gain of the power amplifier in response to receiving the second signal at the first state.

According to another embodiment, the front-end module further comprises a latch circuit coupled to the differential amplifier and configured to maintain the second signal at the first state while the voltage level of the first signal is below the threshold level. In one embodiment, in response to the amplifier turning on, after previously being turned off, the latch circuit is configured to be reset such that it allows the second signal to be driven to the second state. In another embodiment, the front-end module further comprises a shut-off circuit coupled to the differential amplifier and configured to decouple the at least one peak detection circuit and the differential amplifier from ground in response to the amplifier turning off.

At least one aspect of the invention is directed to a wireless device comprising a transceiver configured to produce a transmit signal, a power amplifier module coupled to the transceiver and configured to receive the transmit signal from the transceiver and to amplify the transmit signal to provide a first Radio Frequency (RF) signal, an antenna configured to receive a second RF signal in a receive mode of operation and to transmit the first RF signal from the power amplifier in a transmit mode of operation, and a distortion detection circuit including an input configured to be coupled to an output stage of a power amplifier in the power amplifier module and to receive the first RF signal from the output stage of the power amplifier, an output configured to be coupled to a module of the power amplifier, at least one peak detection circuit coupled to the input of the distortion detection circuit and configured to monitor the first RF signal and output a first signal based on positive voltage peaks of the first RF signal, and a differential amplifier having an input coupled to the at least one peak detection circuit and configured to monitor the first signal and provide a second signal to the output in response to a voltage of the first signal exceeding a threshold level indicative of distortion in the first RF signal.

According to one embodiment, the at least one peak detection circuit includes a positive peak detection circuit coupled between the input of the distortion detection circuit and the differential amplifier. In another embodiment, the positive peak detection circuit has a diode coupled to the input of the distortion detection circuit, a capacitor coupled between the diode and ground, a first resistor coupled between the diode and the input of the differential amplifier, and a second resistor coupled between the input of the differential amplifier and ground. In another embodiment, the positive peak detection circuit is configured to output the first signal having a voltage level following the positive voltage peaks of the first RF signal.

According to another embodiment, the at least one peak detection circuit further includes a negative peak detection circuit coupled between the input of the distortion detection circuit and the differential amplifier. In one embodiment, the positive peak detection circuit has a first diode with an anode coupled to the input of the distortion detection circuit, a capacitor coupled between a cathode of the first diode and ground, and a first resistor coupled between the cathode of the diode and the input of the differential amplifier. In another embodiment, the negative peak detection circuit has a second diode with a cathode coupled to the input of the distortion detection circuit, a capacitor coupled between an anode of the second diode and ground, and a second resistor coupled between the anode of the second diode and the input of the differential amplifier. In one embodiment, the positive peak detection circuit is configured to monitor positive voltage peak levels of the first RF signal, the negative peak detection circuit is configured to monitor negative voltage peak levels of the first RF signal, and the positive and negative peak detection circuits are further configured to output, in combination, the first signal having a voltage level equal to an average of the monitored positive voltage peak levels and the monitored negative voltage peak levels.

According to one embodiment, the differential amplifier is configured to compare a voltage level of the first signal to the threshold level, to provide the second signal to the output at a first state in response to the voltage level of the first signal exceeding the threshold level, and to provide the second signal to the output at a second state in response to the voltage level of the first signal being below the threshold level. In one embodiment, the power amplifier includes a bias module configured to receive the second signal from the differential amplifier and to reduce gain of the power amplifier in response to receiving the second signal at the first state.

According to another embodiment, the wireless device further comprises a latch circuit coupled to the differential amplifier and configured to maintain the second signal at the first state while the voltage level of the first signal is below the threshold level. In one embodiment, the wireless device further comprises a controller and a shut-off circuit coupled to the at least one peak detection circuit, the differential amplifier, and the controller, the shut-off circuit configured to receive an amplifier enable signal from the controller and to decouple the at least one peak detection circuit and the differential amplifier from ground in response to receiving the amplifier enable signal in a first state. In another embodiment, the shut-off circuit is further configured to couple the at least one peak detection circuit and the differential amplifier to ground in response to receiving the amplifier enable signal in a second state.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
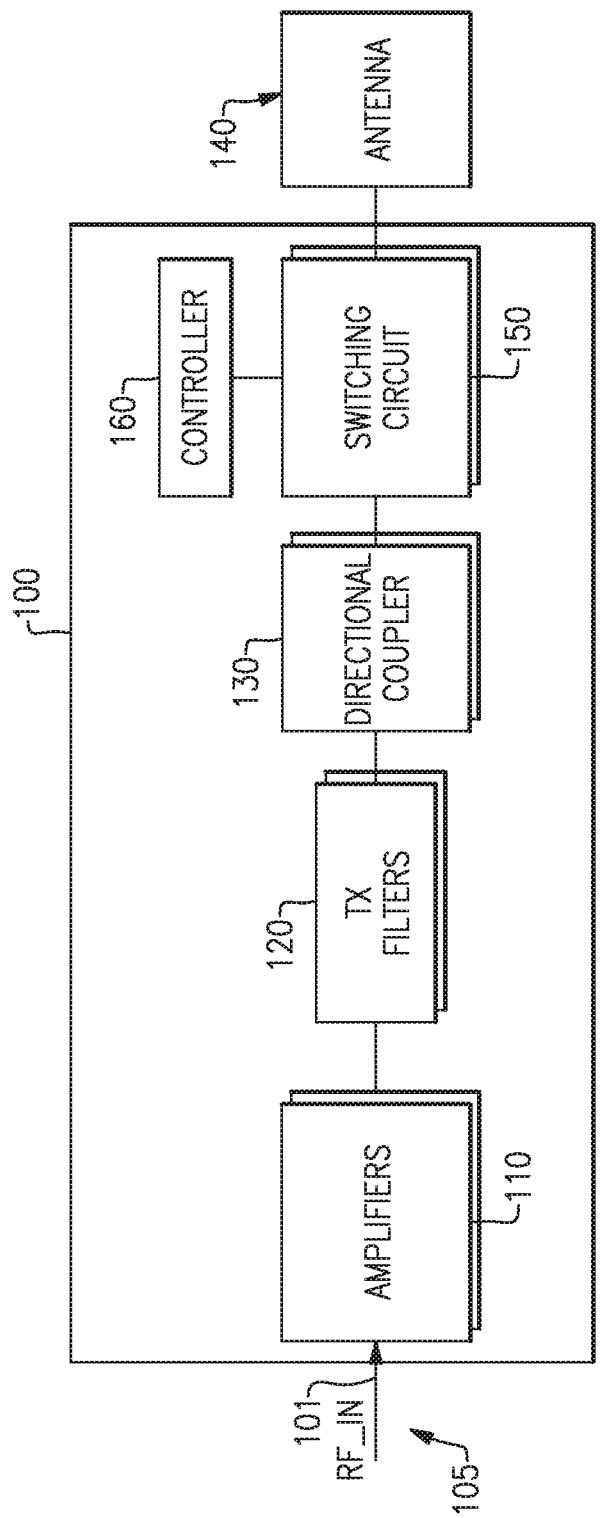
FIG. 1 is a block diagram of one example of a conventional RF front-end system.

As discussed above, in conventional RF front-end systems (e.g., as shown in FIG. 1), it is generally desired to match the output impedance of the amplifier module 110 with the load impedance of the antenna 140 such that reflections from the antenna are reduced or eliminated and maximum power is transferred from the amplifier module 110 to the antenna. A mismatch between the output impedance of the amplifier module 110 and the load impedance of the antenna 140 due to a change in properties of the antenna 140 (for example, such as the antenna being located on top of a metal surface or the antenna being blocked, such as by a user's hand, etc.) can result in reflections from the antenna 140 to the amplifier module 110. Reflections from the antenna 140 to the amplifier module 110, and resulting standing waves, can impact the behavior of power amplifiers in the amplifier module 110 and reduce efficiency of the power amplifiers. Reflections from the antenna 140 can also cause degraded linearity, increased distortion, or damage to the power amplifiers.

Some common solutions for detecting dangerous conditions at the power amplifier involve the use of sensors configured to monitor secondary parameters of an RF transmitter which indirectly indicate a mismatch. For example, such conventional sensors may be configured to sense forward or reflected power at the output of a power amplifier or include a diode stack configured to detect when peak collector voltage of a power amplifier in the transmitter is above a threshold. Other indirect solutions include adding resistors in series with power supply lines, the resistors configured to cause the DC voltage of the power supply line to drop at high power, thereby limiting the maximum output power to a safe level. However, such indirect sensing solutions typically do not work well over a wide temperature range and can prove inaccurate as they do not involve monitoring for actual conditions that could cause power amplifier damage (or distortion), but only secondary parameters that may indicate danger to the power amplifier.

Furthermore, they can cause false indications of issues with the power amplifier and trigger prematurely.

Rather than sensing indirect indications of a mismatch, other solutions involve utilizing an RF limiter to prevent a power amplifier from being driven too hard during a mismatch or overdesigning a power amplifier to account for potential mismatches; however, such solutions typically require the power amplifier to be relatively large, inefficient, and expensive.

When a power amplifier in an RF transmitter is operating in the linear region, the output voltage waveform (e.g., on a collector of a final common emitter gain stage of the power amplifier) is a symmetrical sine wave. However, if the power amplifier is driven too hard, for example, due to a mismatched load, firmware errors, or a feedback loop causing the power amplifier to be driven harder to recover power caused by an impedance mismatch, the output waveform of the power amplifier may become distorted or asymmetrical.

For example, clipping of the output voltage waveform can occur once the power amplifier becomes saturated. When clipping, the sine wave becomes peaked (i.e., the negative peak portion of the waveform flattens and the positive peak portions of the waveform become sharper). Clipping is an indication that the power amplifier is in danger of becoming damaged through excessive peak voltage. In at least one embodiment described herein, a distortion detection circuit is provided that directly monitors the output voltage waveform at the collector of a power amplifier in an RF transmitter for clipping to identify saturation of the power amplifier due to a mismatch or excessive RF drive. In another embodiment described herein, a distortion detection circuit is provided that directly monitors the output voltage waveform at the collector of a power amplifier in an RF transmitter for distortion in the waveform (i.e., voltage peaks greater than a threshold) directly indicating a mismatch or excessive RF drive.

By directly monitoring the output voltage waveform for distortion (e.g., clipping or peaks greater than a threshold), the distortion detection circuit described herein is more accurate than the traditional solutions identified above as the circuit is monitoring for actual distortion and not merely indirect indications of potential mismatch. In addition, as the circuit described herein has limited use of diodes, it is not as temperature sensitive as prior solutions.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 2:
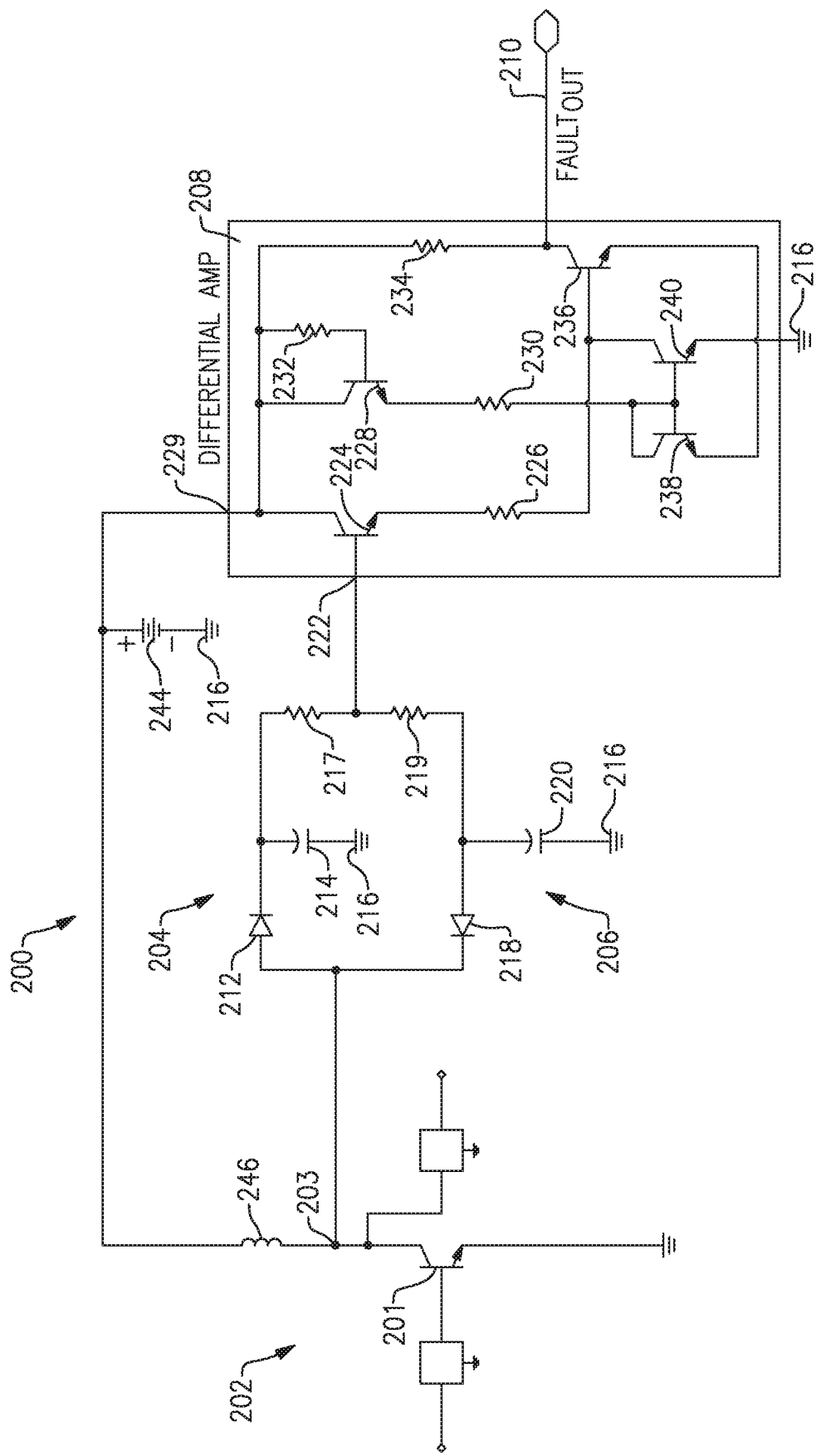
FIG. 2 is a schematic diagram of one embodiment of a distortion detection circuit according to aspects of the present invention.

FIG. 2 is a circuit diagram of one embodiment of a distortion detection circuit 200 as described herein. The distortion detection circuit 200 includes an input 203, a positive peak detection circuit 204, a negative peak detection circuit 206, a differential amplifier 208, and an output 210. The positive peak detection circuit 204 includes a first diode 212, a first capacitor 214, a first resistor 217. The negative peak detection circuit 206 includes a second diode 218, a second capacitor 220, and a second resistor 219. The differential amplifier 208 includes a first input 222, a first transistor 224, a third resistor 226, a second transistor 228, a second input 229, a fourth resistor 230, a fifth resistor 232, a sixth resistor 234, a third transistor 236, a fourth transistor 238, and a fifth transistor 240. According to one embodiment, the transistors of the differential amplifier 208 are Bipolar Junction Transistors (BJT); however, in other embodiments, different types of transistors can be utilized. In one embodiment, the differential amplifier 208 includes all NPN type BJTs; however, in other embodiments, the BJTs of the differential amplifier 208 can be configured differently. In one embodiment, the diodes of the circuit 200 are Schottky or low-barrier Schottky diodes; however, in other embodiments, different types of diodes can be utilized. In other embodiments, the differential amplifier 208 can be configured differently depending on the semiconductor technology that is utilized. The circuit 200 further includes a power supply 244 (e.g., a battery).

The input 203 of the distortion detection circuit 200 is configured to be coupled to the collector of an output stage 202 of a power amplifier (e.g., a power amplifier 110 within the RF FEM 100 shown in FIG. 1). In at least one embodiment, the amplifier output stage 202 includes a power transistor 201 and an inductor 246 configured to supply voltage to the transistor 201 and the input 203 of the distortion detection circuit 200 is configured to be coupled to the collector of the power transistor 201. The anode of the first diode 212 is coupled to the input 203 and the cathode of the first diode 212 is coupled to a first terminal of the first resistor 217. A second terminal of the first resistor 217 is coupled to the first input 222 of the differential amplifier 208 and the first capacitor 214 is coupled between the cathode of the first diode 212 and ground 216. The cathode of the second diode 218 is coupled to the input 203 of the distortion detection circuit 200 and the anode of the second diode 218 is coupled to a first terminal of the second resistor 219. A second terminal of the second resistor 219 is coupled to the first input 222 of the differential amplifier 208 and the second capacitor 220 is coupled between the anode of the second diode 218 and ground 216. The positive peak detection circuit 204 and the negative peak detection circuit 206 are substantially identical except for the alternating orientation of the first diode 212 and the second diode 218. Both the positive peak detection circuit 204 and the negative peak detection circuit 206 are referenced to the reference voltage (e.g., 5V) provided by the power supply 244.

The first input 222 of the differential amplifier is coupled to the base of the first transistor 224 and the collector of the first transistor 224 is coupled to the power supply 244 via the second input 229. A positive terminal of the power supply 244 is coupled to the collector of the first transistor 224 and a negative terminal of the power supply 244 is coupled to ground 216. The emitter of the first transistor 224 is coupled to a first terminal of the third resistor 226 and a second terminal of the third resistor 226 is coupled to the base of the third transistor 236. The collector of the second transistor 228 is coupled to the collector of the first transistor 224 and the base of the second transistor 228 is coupled to the collector of the first transistor 224 via the fifth resistor 232. According to at least one embodiment, the fifth resistor 232 makes the circuit less sensitive to beta variations in the transistors; however, in some embodiments the fifth resistor 232 is optional and the base of the second transistor 228 can be coupled directly to the collector of the first transistor 224.

The emitter of the second transistor 228 is coupled to a first terminal of the fourth resistor 230 and a second terminal of the fourth resistor 230 is coupled to the base of the fourth transistor 238. A first terminal of the sixth resistor 234 is coupled to the collector of the first transistor 224 and a second terminal of the sixth resistor 234 is coupled to the output 210. According to one embodiment, the sixth resistor 234 is also part of a current source in a bias circuit of the power amplifier to which the output 210 is coupled.

The collector of the third transistor 236 is coupled to the output 210 and the collector of the fourth transistor 238 is coupled to the base of the fourth transistor. The collector of the fifth transistor 240 is coupled to the base of the third transistor 236 and the base of the fourth transistor 238 is coupled to the base of the fifth transistor 240. The emitters of the fourth transistor 238, the fifth transistor 240, and the third transistor 236 are coupled to ground 216.

Figure 3:
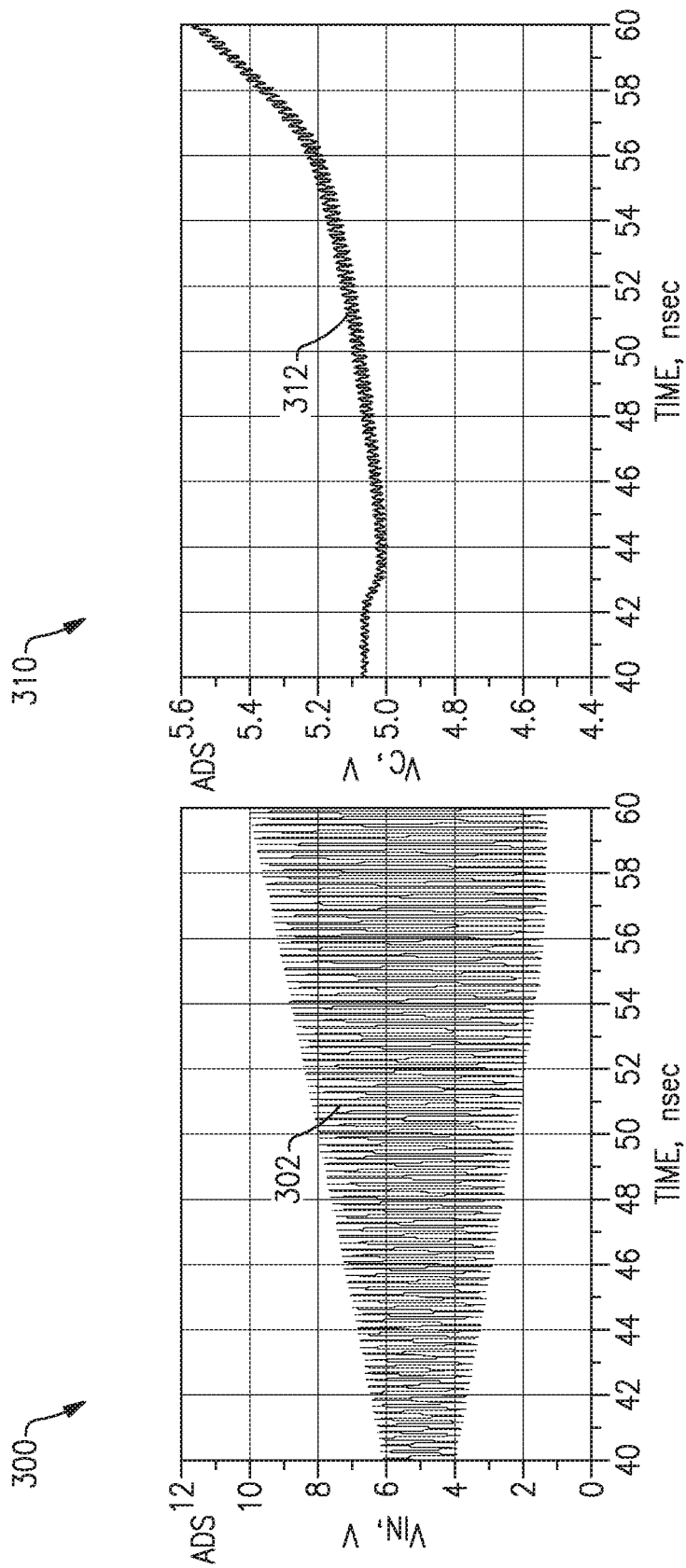
FIG. 3 includes graphs illustrating operation of peak detection circuits of the distortion detection circuit of FIG. 2 according to aspects of the present invention.

FIG. 3 includes graphs 300, 310 illustrating operation of the positive peak detection circuit 204 and the negative peak detection circuit 206. The graph 300 includes a first trace 302 representing the input voltage (Vin) to the positive peak detection circuit 204 and the negative peak detection circuit 206 (i.e., the voltage at the input 203). The first trace 302 illustrates an RF signal starting at low power and ramping up to a higher level until it begins to clip/distort. The graph 310 includes a second trace 312 representing the resulting voltage (Vc) provided from the positive peak detection circuit 204 and the negative peak detection circuit 206 to the first input 222 of the differential amplifier 208. Operation of the positive peak detection circuit 204 and the negative peak detection circuit 206 is discussed below with respect to FIGS. 2-3.

An RF signal (e.g., the signal 302 shown in FIG. 3) provided by the output stage 202 of the power amplifier (e.g., to an antenna such as the antenna 140 shown in FIG. 1) is monitored by the positive peak detection circuit 204 and the negative peak detection circuit 206. The positive peak detection circuit 204 monitors the upper voltage peaks of the RF signal 302 and the negative peak detection circuit 206 monitors the lower voltage peaks (i.e. valleys) of the RF signal 302. More specifically, the positive peak detection circuit 204 outputs a signal (to the first input 222 of the differential amplifier 208) that follows the positive voltage peaks of the RF signal 302 at the input 203 and the negative peak detection circuit 206 outputs a signal (to the first input 222 of the differential amplifier 208) that follows the negative voltage peaks of the Rf signal 302 at the input 203.

As shown in FIG. 3, when the output transistor is not clipping, such as when the output impedance of the output stage 202 of the power amplifier is matched to the load impedance of a corresponding amplifier module and the amplifier is not driven to excess, the RF signal 302 provided by the output stage 202 of the power amplifier, and monitored by the distortion detection circuit 200, is generally an undistorted and symmetrical waveform. As such, when the output signals of the positive peak detection circuit 204 and the negative peak detection circuit 206 are averaged at the first input 222 of the differential amplifier 208 (through the use of two equal valued resistors 217, 219), the resulting voltage 312 at the first input 222 is about equal to the reference voltage (e.g., 5V) from the power supply 244.

As the power amplifier is driven harder, for example, due to a transceiver driving the power amplifier harder in response to a mismatch, the power amplifier feeding a mismatch, or some other condition, the positive and negative voltage peaks of the RF signal 302 increase. As the power amplifier continues to be driven harder, the positive voltage peaks of the RF signal 302 will continue to increase while the negative peaks (i.e., valleys) flatten to a substantially constant level and become clipped (because the base-emitter junction of the output stage 202 starts to become forward biased). In response to the continuously increasing positive peaks and the substantially constant negative peaks of the asymmetrical RF signal 302, the resulting average voltage 312 at the first input 222 of the differential amplifier increases. The increasing average voltage 312 at the first input 222 of the differential amplifier directly indicates increasing positive voltage peaks and clipping (i.e., flattened) negative peaks.

The differential amplifier 208 monitors the voltage 312 at the first input 222 and compares the voltage 312 at the first input 222 to a reference voltage derived from the voltage at the second input 229. The effective reference voltage can be offset by adjusting the sizes of the resistors in the differential amplifier 208 to change the threshold at which the circuit reacts to clipping. In response to the voltage 312 not exceeding the reference voltage, the differential amplifier 208 outputs a signal in a first state to the output 210 indicating that the distortion detection circuit 200 has not detected a distorted/asymmetric signal output by the output stage 202 of the amplifier. In response to the voltage 312 exceeding the reference voltage, the differential amplifier 208 outputs the signal in a second state to the output 210 indicating that the distortion detection circuit 200 has detected a distorted/asymmetric signal output by the output stage 202 of the amplifier (e.g., due to an impedance mismatch or amplifier overdrive). In one embodiment, the differential amplifier 208 outputs a high signal in response to the voltage 312 not exceeding the reference voltage and outputs a low signal in response to the voltage 312 exceeding the reference voltage; however, in other embodiments, the differential amplifier can be configured differently.

Figure 4:
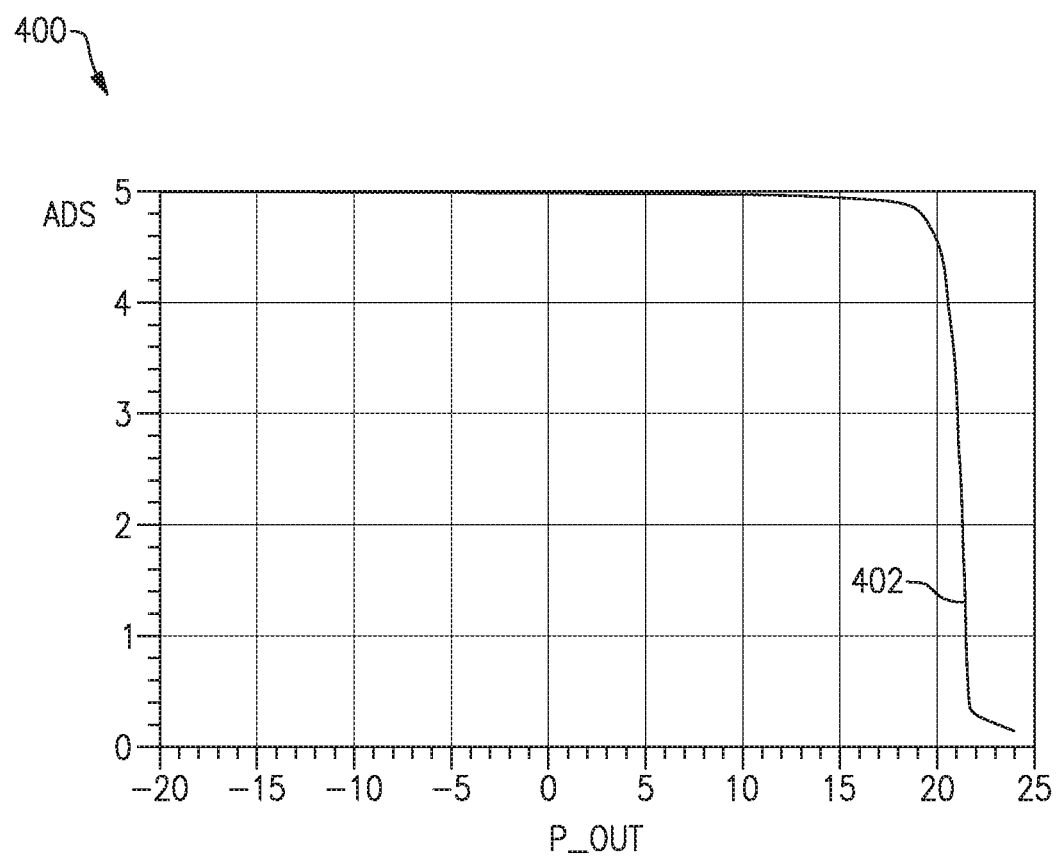
FIG. 4 includes a graph illustrating operation of the distortion detection circuit of FIG. 2 according to aspects of the present invention.

For example, FIG. 4 includes a graph 400 illustrating a trace 402 representing the output of the differential amplifier 208. As can be seen in FIG. 4, the output 402 of the differential amplifier 208 is normally at a high state when the voltage 312 does not exceed the reference voltage (in response to the distortion detection circuit 200 not detecting a distorted/asymmetric signal output by the output stage 202 of the amplifier). The output 402 of the differential amplifier 208 goes to a low state when the voltage 312 exceeds the reference voltage (in response to the distortion detection circuit 200 detecting a distorted/asymmetric signal output by the output stage 202 of the amplifier).

The output signal 402 of the differential amplifier 208 can be provided to another module of the corresponding amplifier such that operation of the amplifier is adjusted in response to the signal to limit negative impacts of identified distortion/asymmetry in the output of the amplifier (e.g., due to an impedance mismatch or amplifier overdrive). For example, the output signal 402 of the differential amplifier 208 can be provided to an earlier stage of the amplifier and the earlier stage of the amplifier can be configured to shut down/adjust operation in response to receiving the output signal of the differential amplifier 208 indicating a distorted/asymmetric signal output by the output stage 202 of the amplifier. In one embodiment, the output signal 402 of the differential amplifier 208 is provided to a bias module of the corresponding amplifier and the bias module is configured to adjust the gain of the amplifier in response to receiving the output signal 402 of the differential amplifier 208 indicating a distorted/asymmetric signal output by the output stage 202 of the amplifier. In at least one embodiment, the output signal 402 of the differential amplifier 208 is provided to a controller (e.g., the controller 160 shown in FIG. 1 which can communicate with the differential amplifier 208) to inform the controller of any identified distortion/asymmetry. In other embodiments, the output signal of the differential amplifier 208 can be provided to any other appropriate module of the corresponding amplifier. In other embodiments, the output signal of the differential amplifier can also be provided to a transceiver or baseband subsystem, so that the transceiver can take appropriate action to prevent clipping, for example by lowering RF drive power.

By directly monitoring the output voltage waveform at the collector of the output stage 202 of the power amplifier for peak clipping/flattening (with the use of the positive peak detector 204, negative peak detector 206, and differential amplifier, as describe above) to identify saturation of the power amplifier due to a mismatch or amplifier overdrive, the distortion detection circuit 200 is more accurate and less susceptible to false triggering (even over a wide temperature range or other operating conditions) than traditional solutions as the circuit is monitoring for actual clipping/saturation and not merely indirect indications of potential mismatch. Operation of the amplifier can then be controlled based on any identified distortion/asymmetry.

Figure 5:
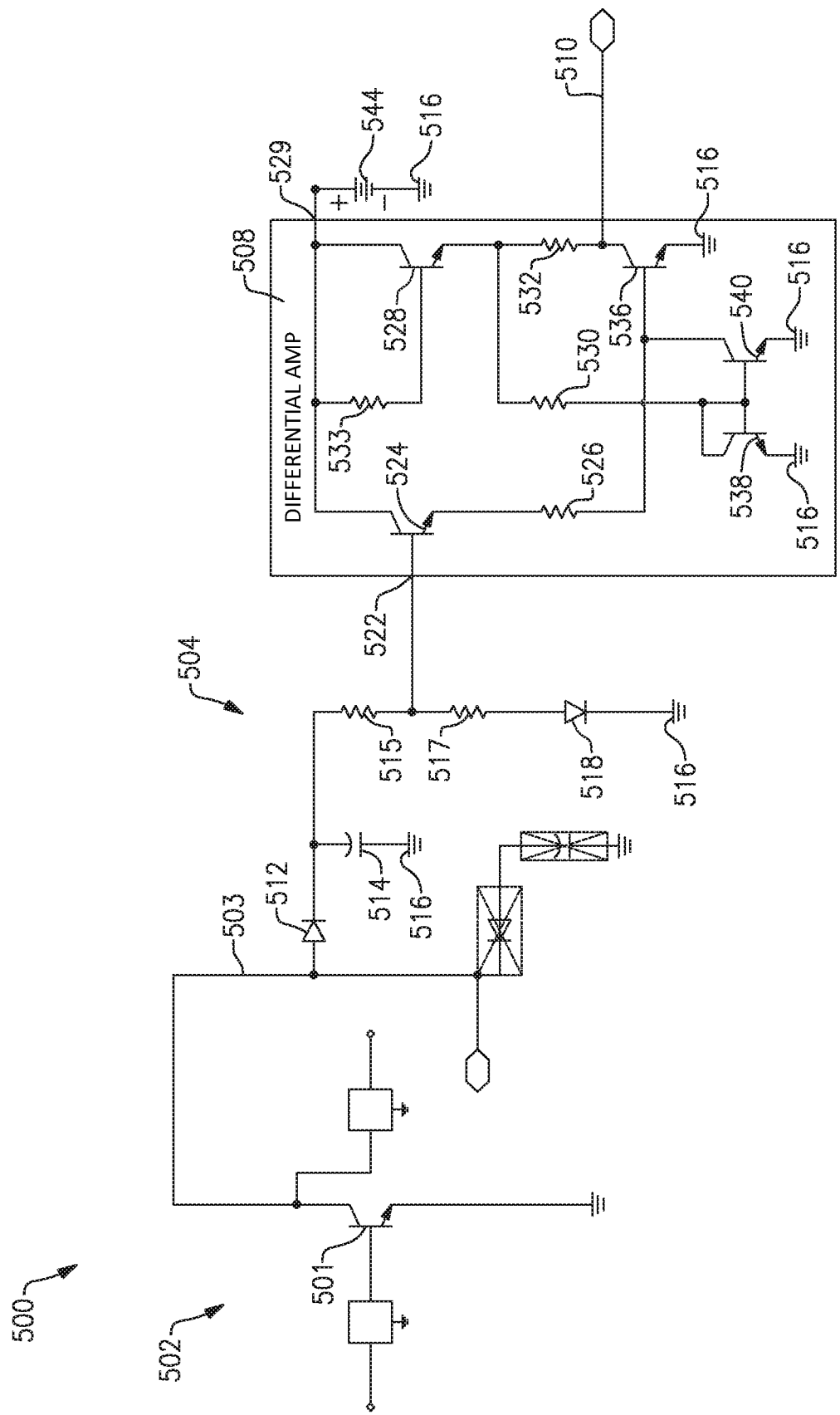
FIG. 5 is a schematic diagram of another embodiment of a distortion detection circuit according to aspects of the present invention.

FIG. 5 is a circuit diagram of another embodiment of a distortion detection circuit 500 as described herein. The distortion detection circuit 500 includes an input 503, a positive peak detection circuit 504, a differential amplifier 508, and an output 510. The positive peak detection circuit 504 includes a first diode 512, a first capacitor 514, a first resistor 515, a second resistor 517, and a second diode 518. Unlike the distortion detection circuit 200 of FIG. 2, the distortion detection circuit of FIG. 5 does not include a negative peak detection circuit. Accordingly, those elements corresponding to second diode 218 and second capacitor 222 of the negative peak detection circuit 206 of FIG. 2 are shown crossed out in FIG. 5.

The differential amplifier 508 includes a first input 522, a first transistor 524, a third resistor 526, a second transistor 528, a second input 529, a fourth resistor 530, a fifth resistor 532, a third transistor 536, a fourth transistor 538, and a fifth transistor 540. According to one embodiment, the transistors of the differential amplifier 508 are Bipolar Junction Transistors (BJT); however, in other embodiments, different types of transistors can be utilized. In one embodiment, the differential amplifier 208 includes all NPN type BJTs; however, in other embodiments, the BJTs of the differential amplifier 208 can be configured differently. In one embodiment, the diodes of the circuit 200 are Schottky or low-barrier Schottky diodes; however, in other embodiments, different types of diodes can be utilized. The circuit 200 further includes a power supply 544 (e.g., a battery). In other embodiments, the differential amplifier 508 can be configured differently depending on the semiconductor technology that is utilized.

The input 503 of the distortion detection circuit 500 is configured to be coupled to the collector of an output stage 502 of a power amplifier (e.g., a power amplifier 110 within the RF FEM 100 shown in FIG. 1). In at least one embodiment, the amplifier output stage 502 includes a power transistor 501 and the input 503 of the distortion detection circuit 500 is configured to be coupled to the collector of the power transistor 501. The anode of the first diode 512 is coupled to the input 503 and the cathode of the first diode 512 is coupled to a first terminal of the first resistor 515. A second terminal of the first resistor 515 is coupled to the first input 522 of the differential amplifier 508. The first capacitor 514 is coupled between the cathode of the first diode 512 and ground 516. A first terminal of the second resistor 517 is coupled to the first input 522 of the differential amplifier 508 and a second terminal of the second resistor 517 is coupled to the anode of the second diode 518. The cathode of the second diode 518 is coupled to ground 516. The positive peak detection circuit 504 is referenced to the reference voltage (e.g., 5V) provided by the power supply 544.

The first input 522 of the differential amplifier is coupled to the base of the first transistor 524. The collector of the first transistor 524 is coupled to the power supply 544. A positive terminal of the power supply 544 is coupled to the collector of the first transistor 524 and a negative terminal of the power supply 544 is coupled to ground 516. The emitter of the first transistor 524 is coupled to a first terminal of the third resistor 526 and a second terminal of the third resistor 526 is coupled to the base of the third transistor 536. The collector of the second transistor 528 is coupled to the collector of the first transistor 524 and the base of the second transistor 528 is coupled to the collector of the first transistor 524. The collector of the second transistor 528 is coupled to the power supply 544 via the second input 529. According to at least one embodiment, the collector of the second transistor 528 is coupled to the second input 529 via a sixth resistor 533 configured to make the circuit less sensitive to beta variations in the transistors; however, in some embodiments the sixth resistor 533 is optional and the collector of the second transistor 528 can be coupled directly to the second input 529.

The emitter of the second transistor 528 is coupled to a first terminal of the fourth resistor 530 and a second terminal of the fourth resistor 530 is coupled to the base of the fourth transistor 538. A first terminal of the fifth resistor 532 is coupled to the emitter of the second transistor 528 and a second terminal of the fifth resistor 532 is coupled to the output 510. According to one embodiment, the fifth resistor 532 is also part of a current source in a bias circuit of the power amplifier to which the output 510 is coupled.

The collector of the third transistor 536 is coupled to the output 510. The collector of the fourth transistor 538 is coupled to the base of the fourth transistor 538. The collector of the fifth transistor 540 is coupled to the base of the third transistor 536. The base of the fourth transistor 538 is coupled to the base of the fifth transistor 540. The emitters of the fourth transistor 538, the fifth transistor 540, and the third transistor 536 are coupled to ground 516. As shown in FIG. 5, the differential amplifier 508 is a current-mirror based differential amplifier; however, in other embodiments, a different type of differential amplifier can be utilized.

Figure 6:
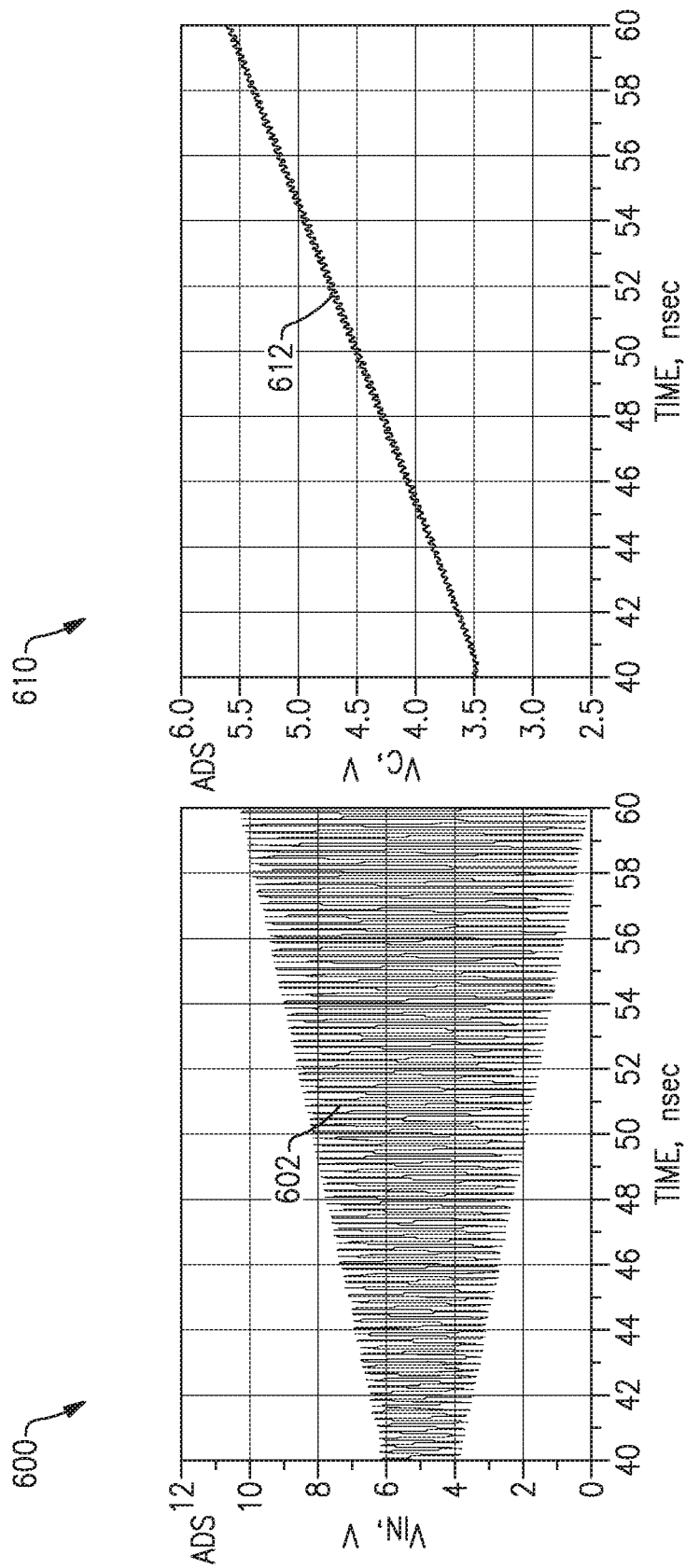
FIG. 6 includes graphs illustrating operation of a peak detection circuit of the distortion detection circuit of FIG. 5 according to aspects of the present invention.

FIG. 6 includes graphs 600, 610 illustrating operation of the positive peak detection circuit 504. The graph 600 includes a first trace 602 representing the input voltage (Vin) to the positive peak detection circuit 604 (i.e., the voltage at the input 503). The graph 610 includes a second trace 612 representing the resulting voltage (Vc) provided from the positive peak detection circuit 504 to the first input 522 of the differential amplifier 508. Operation of the positive peak detection circuit 504 is discussed below with respect to FIGS. 5-6.

The distortion detection circuit 500 only includes a positive peak detection circuit 504, unlike the distortion detection circuit 200 shown in FIG. 2 which includes both a positive peak detection circuit 204 and a negative peak detection circuit 206. An RF signal (e.g., the signal 602 shown in FIG. 6) provided by the output stage 502 of the power amplifier (e.g., to an antenna such as the antenna 140 shown in FIG. 1) is monitored by the positive peak detection circuit 504. The positive peak detection circuit 504 monitors the upper voltage peaks of the RF signal 602. More specifically, the positive peak detection circuit 504 monitors the voltage of the RF signal 602 at the input 503 through the voltage divider formed by the first resistor 515 and the second resistor 517 and outputs a signal (to the first input 522 of the differential amplifier 508) that follows the positive voltage peaks of the RF signal 602 at the input 503. For example, as shown in FIG. 6, the signal 612 output by the positive peak detection circuit 504 follows the upper voltage peaks of the RF signal 602 at the input 503.

As the power amplifier is driven harder, the positive peaks of the RF signal 602 increase and the output signal 612 of the positive peak detection circuit 504 (that follows the positive peaks of the RF signal 602) also increases. The output signal 612 of the positive peak detection circuit 504 is provided to the first input 522 of the differential amplifier 508.

The differential amplifier 508 monitors the voltage at the first input 522 (i.e., the voltage of the signal 612 output by the positive peak detection circuit 504) and compares the voltage 612 at the input to a reference voltage (e.g., set by a resistor ratio of the differential amplifier 508 and/or the voltage divider including the first resistor 515 and second resistor 517). In response to the voltage 612 not exceeding the reference voltage, the differential amplifier 508 outputs a signal in a first state to the output 510 representing that the distortion detection circuit 500 has not detected positive peaks from the output stage 502 of the amplifier at a level indicating an impedance mismatch or power amplifier overdrive. In response to the voltage 612 exceeding the reference voltage, the differential amplifier 508 outputs the signal in a second state to the output 510 representing that the distortion detection circuit 500 has detected positive peaks from the output stage 502 of the amplifier at a level indicating an impedance mismatch or power amplifier overdrive. In one embodiment, the differential amplifier 508 outputs a high signal in response to the voltage 612 not exceeding the reference voltage and outputs a low signal in response to the voltage 612 exceeding the reference voltage; however, in other embodiments, the differential amplifier can be configured differently.

Figure 7:
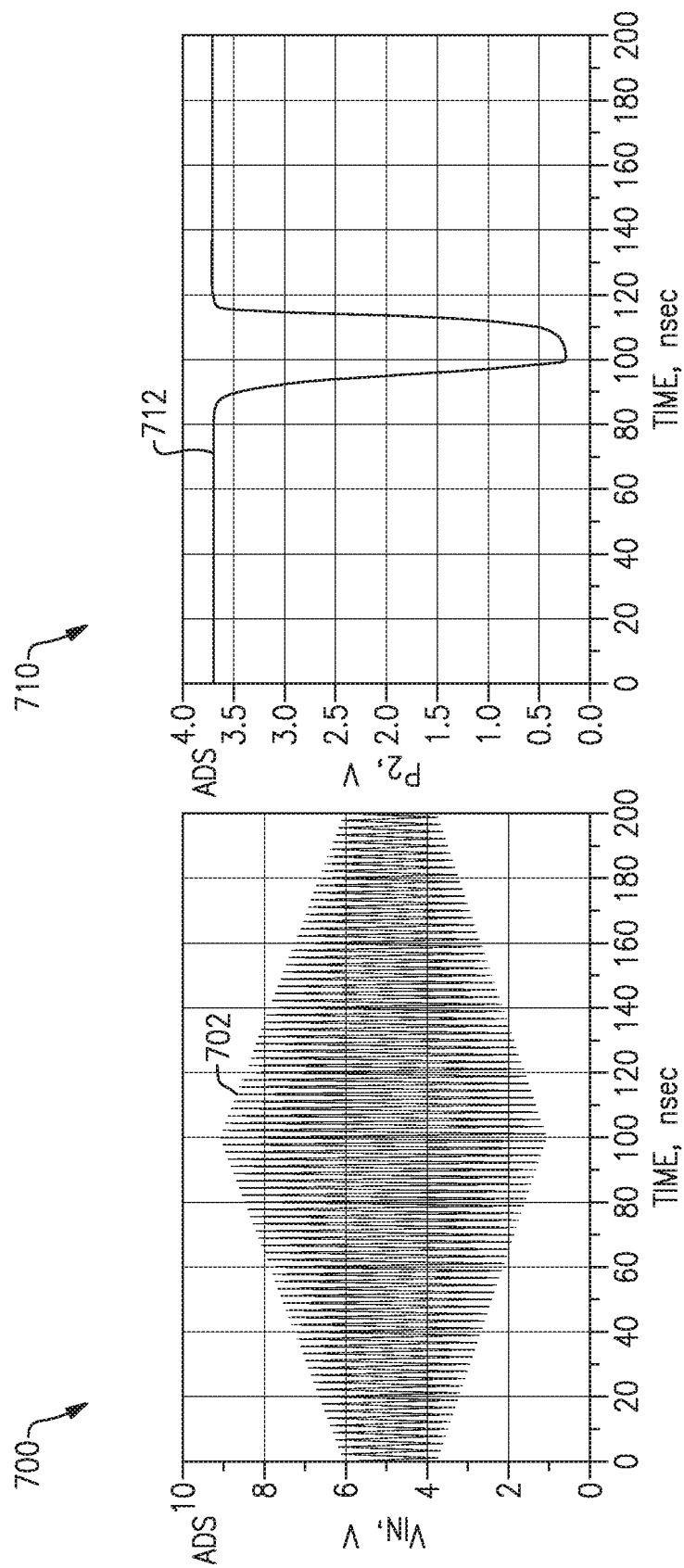
FIG. 7 includes graphs illustrating operation of the distortion detection circuit of FIG. 5 according to aspects of the present invention.

For example, FIG. 7 includes a graph 700 illustrating a trace 702 representing the signal provided from the output stage 502 of the amplifier to the distortion detection circuit 500 and a graph 710 illustrating a trace 712 representing the output signal of the differential amplifier 508. As shown in FIG. 7, while the signal 702 provided from the output stage 502 of the amplifier to the distortion detection circuit 500 is less than the voltage threshold defined by the detection circuit 500, the signal output by the differential amplifier is high. Once the signal 702 provided from the output stage 502 of the amplifier to the distortion detection circuit 500 is greater than the voltage threshold defined by the detection circuit 500, the output signal of the differential amplifier 508 goes low.

The output signal 712 of the differential amplifier 508 can be provided to another module of the corresponding amplifier such that the amplifier is operated in response to the signal to limit negative impacts of identified distortion (e.g., overdriving) in the output of the amplifier (e.g., due to an impedance mismatch). For example, the output signal 712 of the differential amplifier 508 can be provided to an earlier stage of the amplifier and the earlier stage of the amplifier can be configured to shut down/adjust operation in response to receiving the output signal of the differential amplifier 508 indicating a distorted signal output by the output stage 502 of the amplifier. In one embodiment, the output signal 712 of the differential amplifier 508 is provided to a bias module of the corresponding amplifier and the bias module is configured to be adjusted in response to receiving the output signal of the differential amplifier 508 indicating a distorted signal output by the output stage 502 of the amplifier. For example, as shown in FIG. 7, the low state signal 712 output from the differential amplifier (indicating voltage peaks 702 above the threshold) is provided to a bias module of the corresponding amplifier. In response to receiving the low state signal 712, the bias module is configured to adjust operation such that the gain of the amplifier is reduced and the voltage peaks of the signal 702 output by the collector of the output stage 502 are reduced (as shown in graph 700). In other embodiments, the output signal of the differential amplifier 508 can also be provided to a transceiver or baseband subsystem, so that the transceiver can take appropriate action to prevent clipping, for example by lowering RF drive power.

By directly monitoring the output voltage waveform at the collector of the output stage 502 of the power amplifier for positive peaks above a threshold (with the use of the positive peak detector 204 and differential amplifier, as describe above) to identify an impedance mismatch, the distortion detection circuit 500 is more accurate than traditional solutions as the circuit is directly monitoring the actual waveform at the collector of the amplifier and not merely indirect indications of potential mismatch.

As shown in FIG. 7, in at least one embodiment, once the voltage peaks of the signal 702 output by the collector of the output stage 502 are reduced below the threshold set by the detection circuit 500, the signal 712 output by the differential amplifier 508 again goes high as the output voltage waveform at the collector of the output stage 502 is reduced. If the amplifier returns to normal operation once the output of the differential amplifier 508 goes high (i.e., the bias module returns to normal operation) and the condition that led to the distortion (e.g., a mismatch) still exists, the amplifier may again be driven hard such that the output of the amplifier exceeds the threshold. Once the threshold is exceeded, the signal 712 output by the differential amplifier 508 may again go low and the bias module will be operated to adjust the gain of the amplifier. Such uncontrolled oscillation of the amplifier and detection circuit 500 may be difficult to manage. Accordingly, a latch circuit may be included in the distortion detection circuit.

Figure 8:
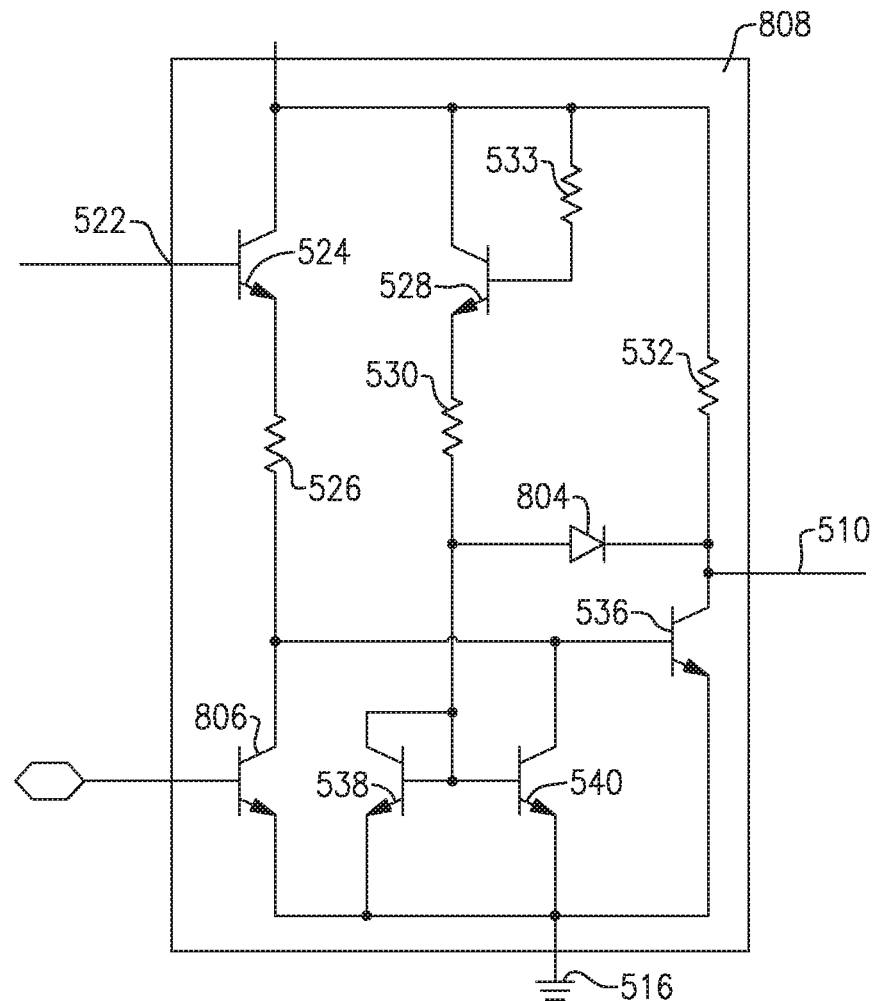
FIG. 8 is a schematic diagram of a differential amplifier with a latch circuit according to aspects of the present invention.

For example, FIG. 8 is a schematic diagram of a differential amplifier 808 in a distortion detection circuit, the differential amplifier 808 including a latch circuit. The differential amplifier 808 shown in FIG. 8 is substantially the same as the differential amplifier 508 shown in FIG. 5 (and the same reference numbers are used to identify the same components on both amplifiers 508, 808), except that the differential amplifier 808 includes a latch circuit. The latch circuit includes a third diode 804 and a sixth transistor 806. The anode of the third diode 804 is coupled to the second terminal of the fourth resistor 530 and the cathode of the third diode 804 is coupled to the output 510. The collector of the sixth transistor 806 is coupled to the base of the third transistor 536. The emitter of the sixth transistor 806 is coupled to ground 516. The base of the sixth transistor 806 is configured to receive a "Clear" signal from another portion of the corresponding detection circuit (e.g., a controller such as the controller 160 shown in FIG. 1 which is in communication with the differential amplifier 808 or a shut-off circuit (as described below with respect to FIG. 10).

Figure 9:
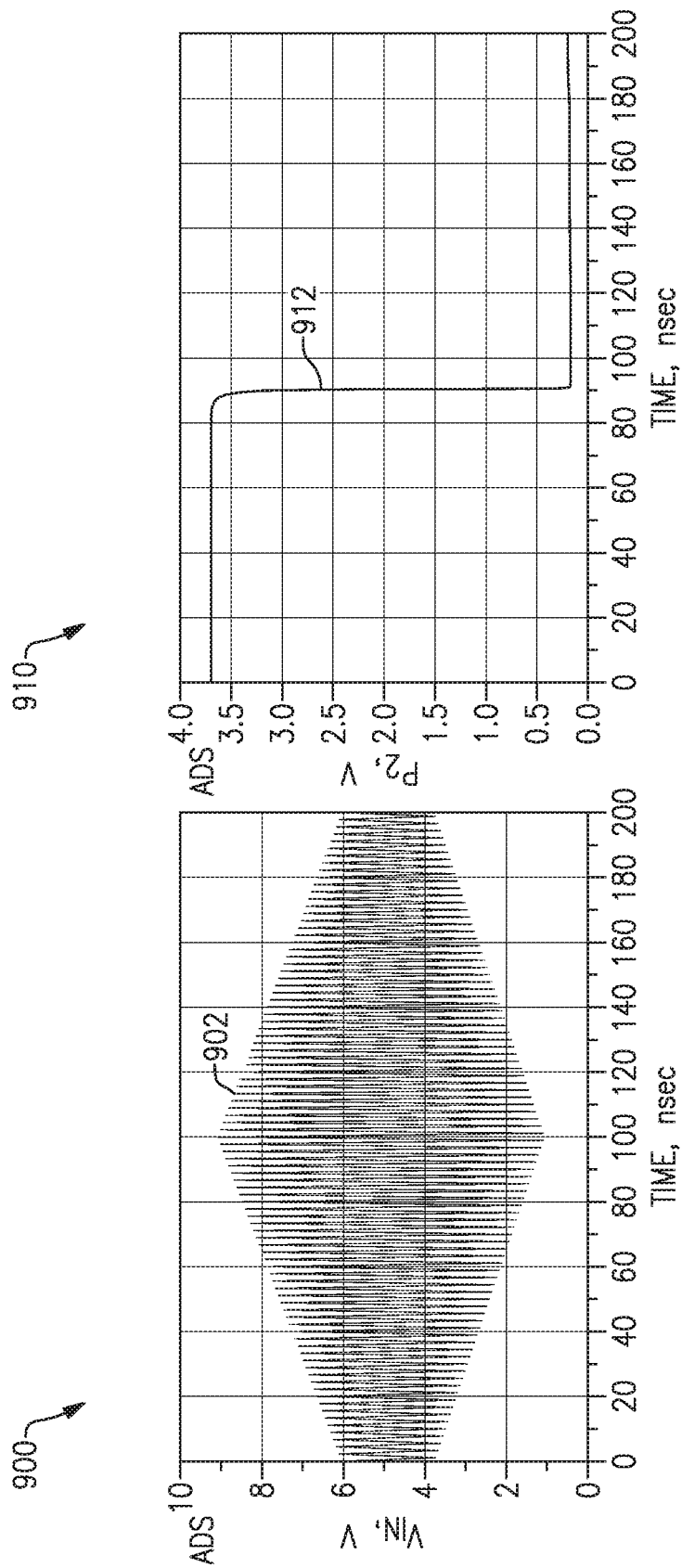
FIG. 9 includes graphs illustrating operation of the differential amplifier of FIG. 8 according to aspects of the present invention.

As discussed above, the differential amplifier 808 is configured to output a low state signal in response to identifying distortion in a signal output by the corresponding amplifier. The third diode 804 of the latch circuit is configured to keep the output of the differential amplifier 808 in a low state until a clear signal is received at the base of the sixth transistor 806. For example, FIG. 9 includes a graph 900 illustrating a trace 902 representing the signal provided from the output stage of an amplifier (e.g., the output stage 502 shown in FIG. 5) to a distortion detection circuit including the differential amplifier 808 (e.g., the distortion detection circuit 500 shown in FIG. 5) and a graph 910 illustrating a trace 912 representing the output signal of the differential amplifier 808. As shown in FIG. 9, while the signal 902 provided from the output stage 502 of the amplifier to the distortion detection circuit 500 is less than the voltage threshold defined by the detection circuit 500, the signal 912 output by the differential amplifier 808 is high. Once the signal 902 provided from the output stage 502 of the amplifier to the distortion detection circuit 500 is greater than the voltage threshold defined by the detection circuit 500, the output signal 912 of the differential amplifier 508 goes low. The third diode 804 operates to maintain the output signal 912 in a low state regardless of the state of the signal 902 provided from the output stage 502 of the amplifier to the distortion detection circuit 500 and will only allow the output signal 912 to go high again upon receipt of a clear signal received at the base of the sixth transistor 806. The clear signal can operate the sixth transistor 806 to couple the base of the third transistor 536 to ground 516, thereby resetting the differential amplifier latch 808.

As described above, a latch circuit is utilized to avoid unwanted oscillation in the detection circuit; however, in other embodiments, a hysteresis-based comparator can be utilized to limit such oscillation. It should be appreciated that although not specifically illustrated in the drawings, the distortion detection circuit 200 of FIG. 2 may include a latch circuit as well to prevent unwanted oscillation in the distortion detection circuit.

Figure 10:
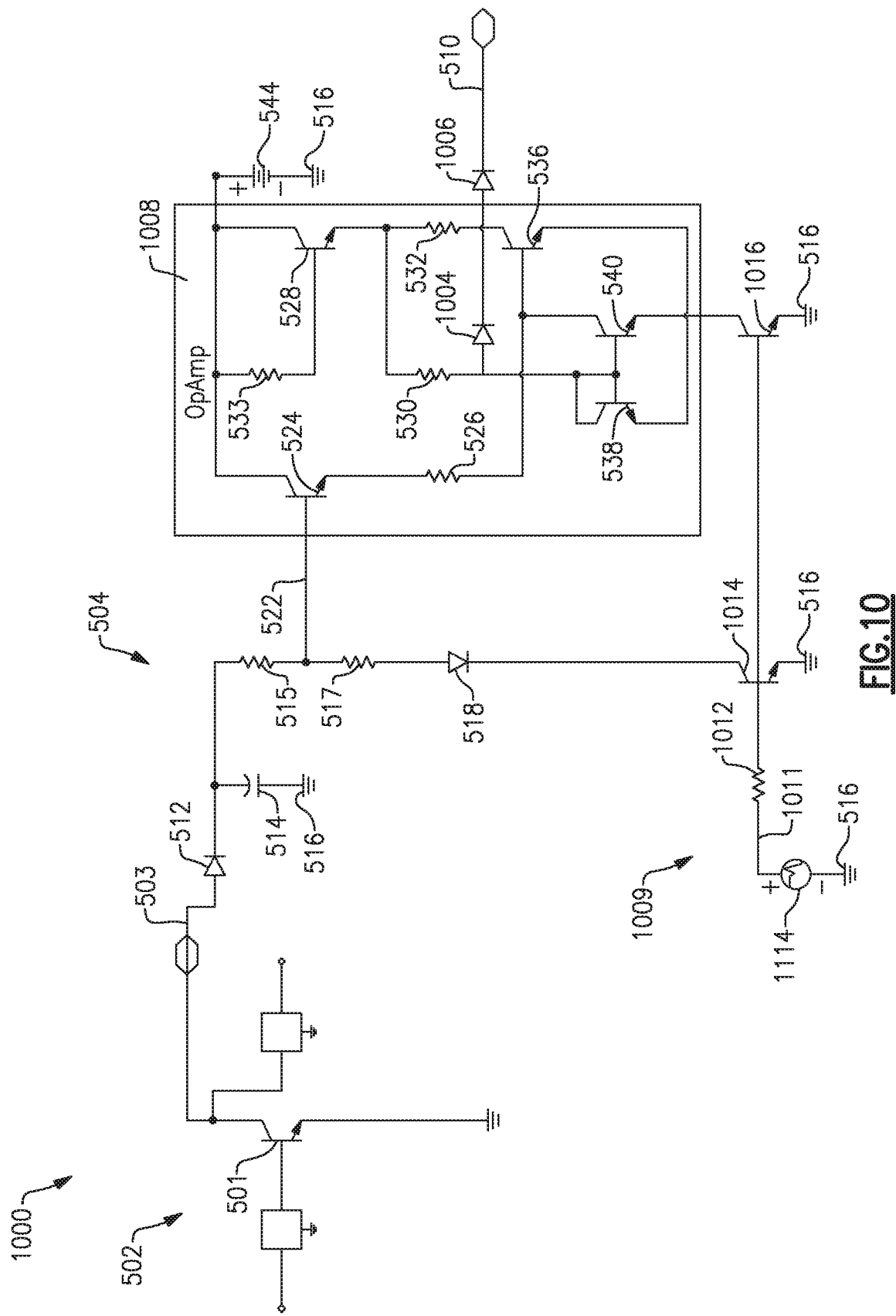
FIG. 10 is a schematic diagram of another embodiment of a distortion detection circuit according to aspects of the present invention.

According to one embodiment, a shut-off circuit may also be included in a distortion detection circuit, as described above, to turn off portions of the distortion detection circuit in order to prevent current being drawn by the distortion detection circuit when the corresponding amplifier is turned off. Such a shut-off circuit may be used with the distortion detection circuit 200 of FIG. 2, or with the distortion detection circuit of FIG. 5, with or without a latch circuit. For example, FIG. 10 is a schematic diagram of a distortion detection circuit 1000 including a latch circuit and a shut-off circuit. The distortion detection circuit 1000 shown in FIG. 10 is substantially the same as the distortion detection circuit 500 shown in FIG. 5 (and the same reference numbers are used to identify the same components on both circuits 500, 800), except that the distortion detection circuit 800 includes a differential amplifier 1008 including a latch circuit. The circuit 800 further includes a shut-off circuit 1009 and an output diode 1006.

The latch circuit includes a third diode 1004. The anode of the third diode 1004 is coupled to the second terminal of the fourth resistor 530 and the cathode of the third diode 1004 is coupled to the anode of the output diode 1006. The cathode of the output diode 1006 is coupled to the output 510. As similarly discussed above, the third diode 1004 operates to keep a low state output signal of the differential amplifier 1008 in a low state until a clear signal is received. According to one embodiment, the latch circuit may also include a transistor, e.g., as discussed above with respect to FIG. 8, that is configured to reset the latch in response to receiving a clear signal.

The shut-off circuit 1009 includes an input 1011, a seventh resistor 1012, a sixth transistor 1014, and a seventh transistor 1016. The input 1011 is coupled to a first terminal of the seventh resistor 1012. A second terminal of the seventh resistor 1012 is coupled to the base of the sixth transistor 1014 and the base of the seventh transistor 1016. The collector of the sixth transistor 1014 is coupled to the cathode of the second diode 518 and the emitter of the sixth transistor 1014 is coupled to ground 516. The collector of the seventh transistor 1016 is coupled to the emitter of the fifth transistor 540 and the emitter of the seventh transistor 1016 is coupled to ground 516.

Figure 11:
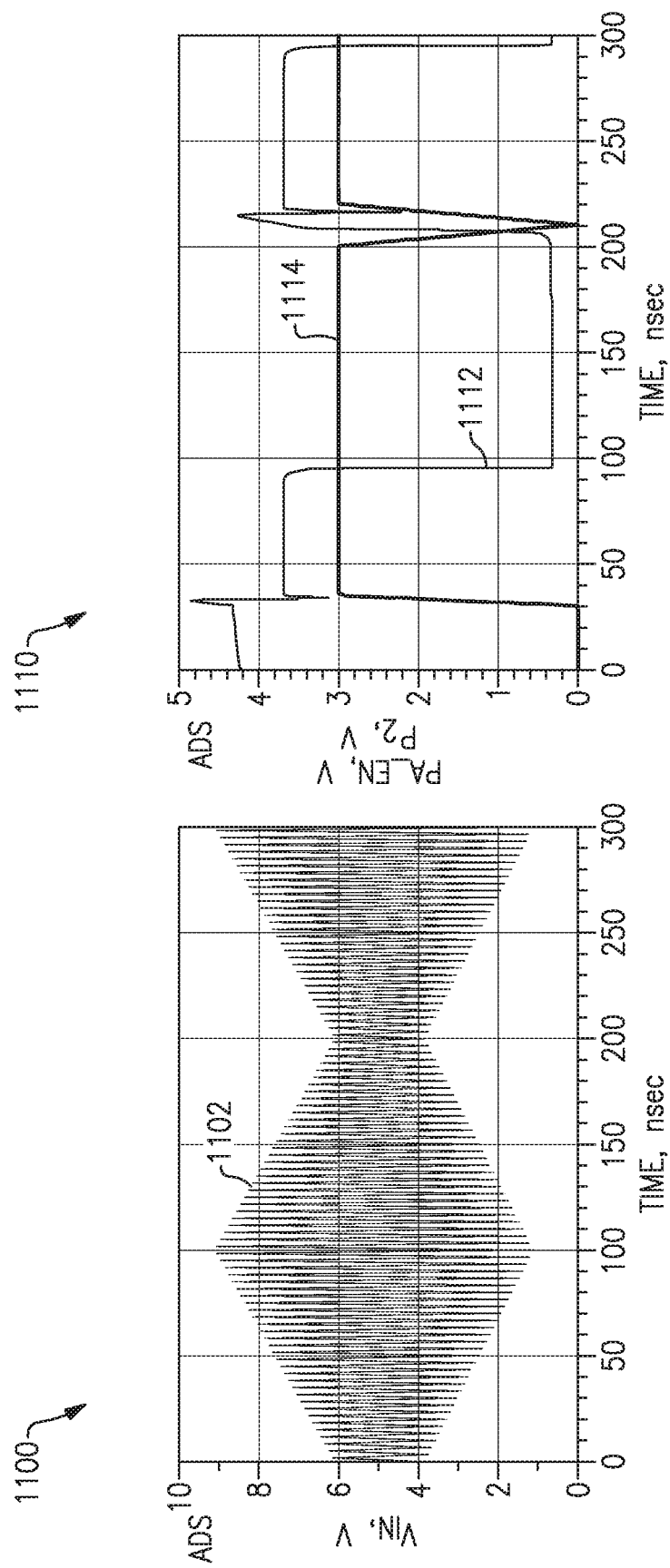
FIG. 11 includes graphs illustrating operation of the distortion detection circuit of FIG. 10 according to aspects of the present invention.

FIG. 11 includes a graph 1100 illustrating a trace 1102 representing the signal provided from the output stage 502 of the amplifier to the distortion detection circuit 1000 and a graph 1110 illustrating a first trace 1112 representing the output signal of the differential amplifier 1008 and a second trace 1114 representing an amplifier enable signal (PA_en). Operation of the circuit 1000 is discussed below with respect to FIGS. 10-11.

The input 1011 is configured to receive the amplifier enable signal (PA_en) 1114. The amplifier enable signal (PA_en) 1114 can be generated by a transceiver, baseband processor, or controller to control the operational state of a power amplifier. For example, the amplifier enable signal (PA_en) 1114 can be set to a high state when the corresponding power amplifier should be turned on and can be set to a low state when the corresponding power amplifier should be turned off.

As shown in FIG. 11, when the amplifier enable signal (PA_en) 1114 is set high and the amplifier is operating, the signal 1102 is provided by the output stage 502 of the amplifier to the distortion detection circuit 1000. Also in response to the amplifier enable signal (PA_en) 1114 being set high, the high amplifier enable signal (PA_en) 1114 operates the sixth transistor 1014 to close, thereby coupling the cathode of the second diode 518 to ground and allowing current through the voltage divider (including the first resistor 515 and the second resistor 517). In response to the amplifier enable signal (PA_en) 1114 being set high, the seventh transistor 1016 is also operated to couple the emitters of the third transistor 536, the fourth transistor 538, and the fifth transistor 540 to ground 516, thereby turning on the differential amplifier 1008.

In response to the amplifier clipping, the signal 1102 increases. As discussed above, when the positive voltage peaks of the signal 1102 are below a threshold, the differential amplifier 1008 outputs a corresponding high state signal 1112, and once the positive voltage peaks of the signal 1102 exceed the threshold, the differential amplifier 1008 outputs a corresponding low state signal 1112. As discussed above, the low state signal 1112 can be provided to an earlier stage of the corresponding amplifier (e.g., a bias module) to adjust operation of the amplifier (e.g., reduce gain). Due to the third diode 1004 of the latch circuit (e.g., as discussed above), the signal 1102 is maintained at the low state, regardless of the level of the voltage peaks of the signal 1102, until the latch circuit is cleared.

When the amplifier enable signal (PA_en) 1114 is set low by the baseband processor, transceiver, or controller, the amplifier is turned off. In at least one embodiment, the amplifier is periodically turned on and off under normal operating conditions. In another embodiment, the amplifier is turned off in response to the baseband processor, transceiver, or controller sensing the low state signal 1112 or for another appropriate reason. Also in response to the amplifier enable signal (PA_en) 1114 being set low, the amplifier enable signal 1114 operates the sixth transistor 1014 to open, thereby de-coupling the cathode of the second diode 518 from ground 516 and preventing leakage current through the voltage divider (including the first resistor 515 and the second resistor 517) while the power amplifier is turned off. In response to the amplifier enable signal (PA_en) 1114 being set low, the amplifier enable signal 1114 also operates the seventh transistor 1016 to open, thereby decoupling the emitters of the third transistor 536, the fourth transistor 538, and the fifth transistor 540 from ground 516 to prevent leakage current through the differential amplifier 1008. The circuit 1000 may also include the output diode 1006 which is configured to prevent leakage current from being provided to an earlier amplifier stage (e.g., a bias module) when the power amplifier is off.

When the transceiver, baseband subsystem, or controller determines that the power amplifier should be turned back on, it sets the amplifier enable signal (PA_en) 1114 high. Once the amplifier enable signal (PA_en) 1114 is high, the amplifier is turned on and the sixth and seventh transistors 1014, 1016 of the detection circuit 1000 are closed. According to at least one embodiment as shown in FIG. 11, once the amplifier enable signal (PA_en) 1114 goes from low to high, the output signal 1112 of the differential amplifier is reset (i.e., the latch is cleared) and the differential amplifier again monitors the output of the positive peak detector to identify distortion in the output signal 1102 provided by the output stage 502 of the amplifier to the distortion detection circuit 1000. The output signal 1112 of the differential amplifier will again go low once the voltage peaks of the signal 1102 exceed the threshold.

Embodiments of the distortion detection circuits disclosed herein, packaged into an FEM (e.g., the FEM 100 discussed above with respect to FIG. 1), may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a wireless router or access point, a set-top-box, a television, a computer monitor, a computer, a modem, a hand held computer, a laptop computer, a tablet computer, an electronic book reader, a wearable computer such as a smart watch, a personal digital assistant (PDA), an appliance, such as a microwave, refrigerator, or other appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

Figure 12:
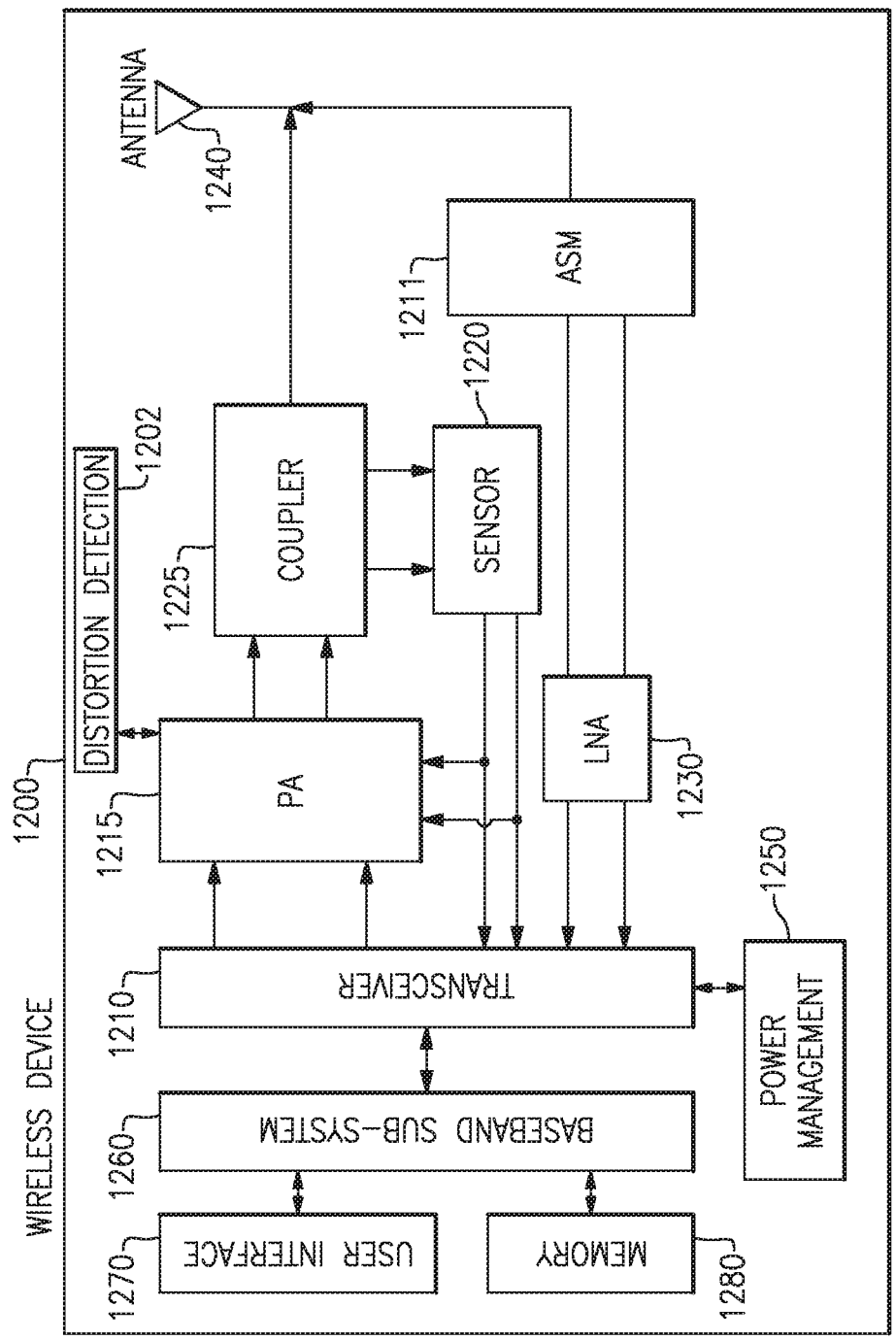
FIG. 12 is a block diagram of a wireless device including a distortion detection circuit according to aspects of the present invention.

FIG. 12 is a block diagram of one embodiment of a wireless device 1200 in which a distortion detection circuit 1202 as described above (e.g., the distortion detection circuits 200, 500, 1000) can be implemented. The wireless device 1200 can be a cellular phone, smart phone, tablet, modem, wireless router, fixed access point, communication network or any other portable or non-portable device configured for voice and/or data communication. The wireless device 1200 can receive and transmit signals from the antenna 1240. The wireless device 1200 includes a transceiver 1210 that is configured to generate signals for transmission and/or to process received signals. In some embodiments, transmission and reception functionalities can be implemented in separate components (e.g. a transmit module and a receiving module) or be implemented in the same module.

Signals generated for transmission are received by the power amplifier (PA) module 1215, which amplifies the generated signals from the transceiver 1210. As will be appreciated by those skilled in the art, the power amplifier module 1215 can include one or more power amplifiers. The power amplifier module 1215 can be used to amplify a wide variety of RF or other frequency-band transmission signals. For example, the power amplifier module 1215 can receive an enable signal that can be used to pulse the output of the power amplifier to aid in transmitting a wireless local area network (WLAN) signal or any other suitable pulsed signal. The power amplifier module 1215 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 1215 and associated components including switches and the like can be fabricated on GaAs substrates using, for example, pHEMT or BiFET transistors, or on a Silicon substrate using CMOS transistors. The wireless device 1200 also includes an LNA module 1230, which may include one or more low noise amplifiers configured to amplify received signals.

The wireless device 1200 also includes the coupler 1225 having one or more coupler sections for measuring transmitted power signals from the power amplifier module 1215 and for providing one or more coupled signals to a sensor module 1220. The sensor module 1220 can in turn send information to the transceiver 1210 and/or directly to the power amplifier module 1215 as feedback for making adjustments to regulate the power level of the power amplifier module 1215. In this way the coupler 1225 can be used to boost/decrease the power of a transmission signal having a relatively low/high power. It will be appreciated, however, that the coupler 1225 can be used in a variety of other implementations.

For example, in certain embodiments in which the wireless device 1200 is a mobile phone having a time division multiple access (TDMA) architecture, the coupler 1225 can advantageously manage the amplification of an RF transmitted power signal from the power amplifier module 1215. In a mobile phone having a time division multiple access (TDMA) architecture, such as those found in Global System for Mobile Communications (GSM), code division multiple access (CDMA), and wideband code division multiple access (W-CDMA) systems, the power amplifier module 1215 can be used to shift power envelopes up and down within prescribed limits of power versus time. For instance, a particular mobile phone can be assigned a transmission time slot for a particular frequency channel. In this case the power amplifier module 1215 can be employed to aid in regulating the power level one or more RF power signals over time, so as to prevent signal interference from transmission during an assigned receive time slot and to reduce power consumption. In such systems, the coupler 1225 can be used to measure the power of a power amplifier output signal to aid in controlling the power amplifier module 1215, as discussed above. The implementation shown in FIG. 12 is exemplary and non-limiting. For example, the implementation of FIG. 12 illustrates the coupler 1225 being used in conjunction with a transmission of an RF signal, however, it will be appreciated that various examples of the coupler 1225 discussed herein can also be used with received RF signals or other signals as well.

The wireless device 1200 also includes the switching circuit 1211 (which may also be called an ASM), which is configured to switch between different bands and/or modes.

As shown in FIG. 12, in certain embodiments the antenna 1240 can both receive signals that are provided to the transceiver 1210 via the switching circuit 1211 and the LNA 1230 and also transmit signals from the wireless device 1200 via the transceiver 1210, the power amplifier module 1215, and the coupler 1225. However, in other examples multiple antennas can be used for different modes of operation.

In the example illustrated in FIG. 12, the coupler 1225 is shown positioned between the power amplifier module 1215 and the antenna 1240. However, as discussed above, the coupler 1225 can be connected at various locations along transmit or receive signal path(s). Further, in the example shown in FIG. 12, the coupler 1225 is shown as an individual component; however, in other examples, the coupler 1225 can be combined with one or more other components of the wireless device 1200. For example, in at least one embodiment, the wireless device 1200 includes an integrated filter-coupler that combines the functionality of the coupler 1225 and a filter. The wireless device 1200 can include any number of filters which can be connected at various locations along transmit or receive signal path(s). Given the benefit of this disclosure, those skilled in the art will appreciate that a variety of other configurations and combinations of the components of the wireless device 1200 may be implemented. According to one embodiment, the LNA 1230 and the switching circuit 1211 are integrated in a single module.

The wireless device 1200 of FIG. 12 further includes a power management system 1250 that is connected to the transceiver 1210 and that manages the power for the operation of the wireless device 1200. The power management system 1250 can also control the operation of a baseband sub-system 1260 and other components of the wireless device 1200. The power management system 1250 can include, or can be connected to, a battery that supplies power for the various components of the wireless device 1200. The power management system 1250 can further include one or more processors or controllers that can control the transmission of signals and can also configure the coupler 1225 based upon the frequency of the signals being transmitted, for example. In addition, the processor(s) or controller(s) of the power management system 1250 may provide control signals to actuate switches, tune elements, or otherwise configure the coupler 1225. In at least one embodiment, the processor(s) or controller(s) of the power management system 1250 can also provide control signals to control the switching circuit 1211 to operate in the transmit or receive mode.

In one embodiment, the baseband sub-system 1260 is connected to a user interface 1270 to facilitate various input and output of voice and/or data provided to and received from the user. The baseband sub-system 1260 can also be connected to memory 1280 that is configured to store data and/or instructions to facilitate the operation of the wireless device, and/or to provide storage of information for the user.

As similarly described above, the distortion detection circuit 1202 directly monitors the collector output of an output stage of at least one power amplifier in the power amplifier module 1215 to identify distortion/asymmetry in the amplifier output. Upon identifying distortion/asymmetry in the amplifier output, the distortion detection circuit 1202 can transmit a signal, identifying the distortion/asymmetry, to an earlier stage of the corresponding power amplifier to adjust operation of the amplifier (e.g., reduce its gain). According to at least one embodiment, the distortion detection circuit 1202 also provides the distortion/asymmetry identifying signal to a controller/processor of the wireless device 1200 and/or the transceiver 1210 and baseband subsystem 1260.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A distortion detection circuit comprising:
an input configured to be coupled to an output stage of an amplifier and to receive an RF signal from the output stage of the amplifier;
an output;
a differential amplifier; and
at least one peak detection circuit coupled to the input and configured to monitor the RF signal and output a first signal based on positive voltage peaks of the RF signal, the at least one peak detection circuit including a positive peak detection circuit, the positive peak detection circuit having a diode coupled to the input of the distortion detection circuit, a capacitor coupled between the diode and ground, a first resistor coupled between the diode and an input of the differential amplifier, and a second resistor coupled between the input of the differential amplifier and ground, the differential amplifier being configured to monitor the first signal and provide a second signal to the output of the distortion detection circuit in response to a voltage of the first signal exceeding a threshold level indicative of distortion in the RF signal.

2. The distortion detection circuit of claim 1 wherein the positive peak detection circuit is configured to output the first signal having a voltage level following the positive voltage peaks of the RF signal.

3. The distortion detection circuit of claim 1 wherein the at least one peak detection circuit further includes a negative peak detection circuit coupled between the input and the differential amplifier.

4. The distortion detection circuit of claim 3 wherein the diode is a first diode having an anode coupled to the input of the distortion detection circuit, the capacitor is a first capacitor coupled between a cathode of the first diode and ground, and the first resistor is coupled between the cathode of the first diode and the input of the differential amplifier.

5. The distortion detection circuit of claim 4 wherein the negative peak detection circuit has a second diode having a cathode coupled to the input of the distortion detection circuit, a second capacitor coupled between an anode of the second diode and ground, and the second resistor is coupled between the anode of the second diode and the input of the differential amplifier.

6. The distortion detection circuit of claim 5 wherein the positive peak detection circuit is configured to monitor positive voltage peak levels of the RF signal, the negative peak detection circuit is configured to monitor negative voltage peak levels of the RF signal, and the positive and negative peak detection circuits are further configured to output, in combination, the first signal having a voltage level corresponding to an average of the monitored positive voltage peak levels and the monitored negative voltage peak levels.

7. The distortion detection circuit of claim 1 wherein the differential amplifier is configured to compare a voltage level of the first signal to the threshold level, to provide the second signal to the output of the distortion detection circuit at a first state in response to the voltage level of the first signal exceeding the threshold level, and to provide the second signal to the output of the distortion detection circuit at a second state in response to the voltage level of the first signal being below the threshold level.

8. The distortion detection circuit of claim 7 further comprising a latch circuit coupled to the differential amplifier and configured to maintain the second signal at the first state while the voltage level of the first signal is below the threshold level.

9. The distortion detection circuit of claim 8 further comprising a shut-off circuit coupled to the differential amplifier and configured to decouple the at least one peak detection circuit and the differential amplifier from ground in response to the amplifier turning off.

10. The distortion detection circuit of claim 9 wherein in response to the amplifier turning on, after previously being turned off, the latch circuit is configured to be reset such that it allows the second signal to be driven to the second state.

11. The distortion detection circuit of claim 1 wherein the differential amplifier is further configured to provide the second signal to one of a transceiver and baseband subsystem.

12. A front-end module for a wireless device comprising:
an input port configured to receive an input Radio Frequency (RF) signal;
a power amplifier coupled to the input port and configured to amplify the input RF signal to provide a first RF signal;
an output configured to be coupled to an antenna, to receive a second RF signal from the antenna in a receive mode of operation, and to transmit the first RF signal from the power amplifier to the antenna in a transmit mode of operation;
a differential amplifier; and
a distortion detection circuit, the distortion detection circuit including an input coupled to an output stage of the power amplifier to receive the first RF signal, an output, and at least one peak detection circuit coupled to the input of the distortion detection circuit and configured to monitor the first RF signal and output a first signal based on positive voltage peaks of the first RF signal, the at least one peak detection circuit including a positive peak detection circuit, the positive peak detection circuit having a diode coupled to the input of the distortion detection circuit, a capacitor coupled between the diode and ground, a first resistor coupled between the diode and an input of the differential amplifier, and a second resistor coupled between the input of the differential amplifier and ground, the differential amplifier having an input coupled to the at least one peak detection circuit and configured to monitor the first signal and provide a second signal to the output of the distortion detection circuit in response to a voltage of the first signal exceeding a threshold level indicative of distortion in the first RF signal.

13. The front-end module of claim 12 wherein the at least one peak detection circuit further includes a negative peak detection circuit coupled between the input of the distortion detection circuit and the differential amplifier.

14. The front-end module of claim 13 wherein:
the diode of the positive peak detection circuit is a first diode having an anode coupled to the input of the distortion detection circuit, the capacitor is a first capacitor coupled between a cathode of the first diode and ground, and the first resistor is coupled between the cathode of the first diode and the input of the differential amplifier; and
the negative peak detection circuit has a second diode having a cathode coupled to the input of the distortion detection circuit, a second capacitor coupled between an anode of the second diode and ground, and the second resistor is coupled between the anode of the second diode and the input of the differential amplifier.

15. The front-end module of claim 12 wherein the differential amplifier is configured to compare a voltage level of the first signal to the threshold level, to provide the second signal to the output of the distortion detection circuit at a first state in response to the voltage level of the first signal exceeding the threshold level, and to provide the second signal to the output of the distortion detection circuit at a second state in response to the voltage level of the first signal being below the threshold level.

16. The front-end module of claim 15 wherein the power amplifier includes a bias module configured to receive the second signal from the differential amplifier and to reduce gain of the power amplifier in response to receiving the second signal at the first state.

\* \* \* \* \*